United States Patent
Antaran

(10) Patent No.: US 11,963,327 B2
(45) Date of Patent: Apr. 16, 2024

(54) FRONT AND REAR LOADING CONTROL CIRCUIT FOR A SERVER POWER SHELF

(71) Applicant: AES Global Holdings PTE Ltd., Singapore (SG)

(72) Inventor: Jerome Emmanuel G. Antaran, Paranaque (PH)

(73) Assignee: AES Global Holdings PTE Ltd., Singapore (SG)

( * ) Notice: Subject to any disclaimer, the term of this patent is extended or adjusted under 35 U.S.C. 154(b) by 317 days.

(21) Appl. No.: 17/211,377

(22) Filed: Mar. 24, 2021

(65) Prior Publication Data
US 2022/0312625 A1    Sep. 29, 2022

(51) Int. Cl.
*H05K 7/14* (2006.01)
*H05K 1/18* (2006.01)

(52) U.S. Cl.
CPC .......... *H05K 7/1492* (2013.01); *H05K 1/181* (2013.01); *H05K 7/1491* (2013.01)

(58) Field of Classification Search
CPC ... H05K 7/1492; H05K 7/1432; H05K 7/1491
See application file for complete search history.

(56) References Cited

U.S. PATENT DOCUMENTS

| | | | |
|---|---|---|---|
| 4,558,914 A | 12/1985 | Prager et al. | |
| 6,968,470 B2 | 11/2005 | Larson et al. | |
| 7,765,347 B2 | 7/2010 | King et al. | |
| 8,708,736 B2 | 4/2014 | Bailey et al. | |
| 9,128,682 B2 | 9/2015 | Dean et al. | |
| 9,231,491 B2 | 1/2016 | Benson et al. | |
| 9,232,678 B2 | 1/2016 | Bailey et al. | |
| 9,301,420 B2 | 3/2016 | Bailey et al. | |
| 9,552,031 B2 | 1/2017 | Sarti | |
| 9,642,282 B2 | 5/2017 | Bailey et al. | |
| 10,238,000 B2 | 3/2019 | Sarti | |
| 2017/0150621 A1 | 5/2017 | Breakstone et al. | |
| 2019/0074667 A1 | 3/2019 | Huang | |

OTHER PUBLICATIONS

Taiwan Office Action for TW Application No. 111111025, dated Nov. 10, 2022; 16 pages.

*Primary Examiner* — Anthony Q Edwards
*Assistant Examiner* — Hung Q Dang

(57) ABSTRACT

Electrical interconnect systems for a server power shelf are disclosed. An electrical interconnect system, which can include multiple connectors and a printed circuit board or other wiring, can allow a control circuit, such as a shelf management controller (SMC), to be accessible via a front or rear of a server power shelf. The control circuit can be communicatively coupled to the backplane of the server power shelf through the electrical interconnect system in either the front or rear position without having to reconfigure or redesign a server power shelf configuration. Further, the control circuit can be hot swappable from both the front-loading position and the rear loading position. Even further, when utilized in the front-loading position, neither the electrical interconnect system nor the control circuit occupy a slot of the server power shelf intended for a power supply or reduce a number of power supplies the shelf can include.

17 Claims, 8 Drawing Sheets

FRONT AND REAR LOADING CONTROL CIRCUIT FOR A SERVER POWER SHELF

BACKGROUND

Data centers and data servers utilize rack systems that hold electronic modules such as power modules (e.g., a power supply unit ("PSU")) to power the data storage and data controllers within the rack systems. Power shelf systems have been implemented to hold an array of PSUs; however, space is limited within each power shelf as the density of circuit(s) and parts within the electronic modules increase. The limited space available in each power shelf has made having a front accessible control circuit, such as a shelf management controller ("SMC"), quite problematic because prior designs required the power shelf system to utilize a PSU slot; thus, a front accessible control circuit shelf system would have one less power supply because of the space needed to accommodate the front accessible control circuit. In addition, those type of front-loading systems did not allow a front-loading SMC to be hot pluggable. The embodiments described herein provide solutions to these problems.

SUMMARY

In certain embodiments, an electronic device can include a circuit having wiring, or traces, to provide a connection between a backplane of a power shelf and a power management controller. The circuit can include a first connector configured to couple to the backplane; a second connector configured to have a first interface that physically couples the power management controller to the circuit such that the wiring or traces provide a connection between the first connector and the second connector to allow the power management controller to communicate with the backplane; a third connector configured to have a second interface that physically couples the power management controller to the circuit such that the wiring or traces provide a connection between the first connector and the third connector to allow the power management controller to communicate with the backplane; and when the circuit is installed in the power shelf, the second connector is accessible at a rear of the power shelf and the third connector is accessible at a front of the power shelf.

In certain embodiments, an electrical interconnect system can include: wiring to provide a connection between a backplane of a server power shelf and a control circuit; a first connector configured to couple to the backplane; a second connector including a first interface configured to communicatively couple to the control circuit, where the wiring provides an electrical connection between the first connector and the second connector; a third connector including a second interface configured to communicatively couple to the control circuit, where the wiring provides an electrical connection between the first connector and the third connector; and when the electrical interconnect system is installed in a server power shelf, the second connector is accessible at a rear of the server power shelf and the third connector is accessible at a front of the power shelf.

In certain embodiments, a device can include a first printed circuit board (PCB) having: first traces to provide a connection between a backplane of a server power shelf and a control circuit; second traces to provide a connection between the backplane of a server power shelf and the control circuit; a first connector configured to couple to the backplane; a second connector configured to communicatively couple the control circuit to the second connector such that the first traces provide an electrical connection between the first connector and the second connector; a third connector configured to communicatively couple the control circuit to the third connector such that the second traces provide an electrical connection between the first connector and the third connector; and the first PCB configured to be installed in a server power shelf such that the second connector is accessible at a proximal end of the server power shelf nearest the backplane and the third connector is accessible at a distal end of the server power shelf.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

With ever increasing density for electronic components for server racks, such as PSUs, every millimeter of space inside a server cabinet or shelf matters. This causes problems for implementing a server power shelf system with a front-loading control circuit, such as an SMC. Typically, a PSU slot is occupied for providing a front-loading control circuit and, thus, the power shelf system loses a portion of it's power supply capacity to accommodate the front-loading controller. In addition, because the previous front-loading controller occupied a PSU slot, the front-loading controller was not hot pluggable.

This disclosure provides solutions for this problem, including a front and rear loading circuit that allows a control circuit to by loaded in a rear accessible location and a front accessible location without taking the space of a PSU slot. This also allows the power shelf system to have the front-accessible control circuit to be hot pluggable. Further, these solutions allow for the power shelf to have minimal reconfiguration engineering to switch between a rear accessible control circuit and a front accessible control circuit.

Figure 1:
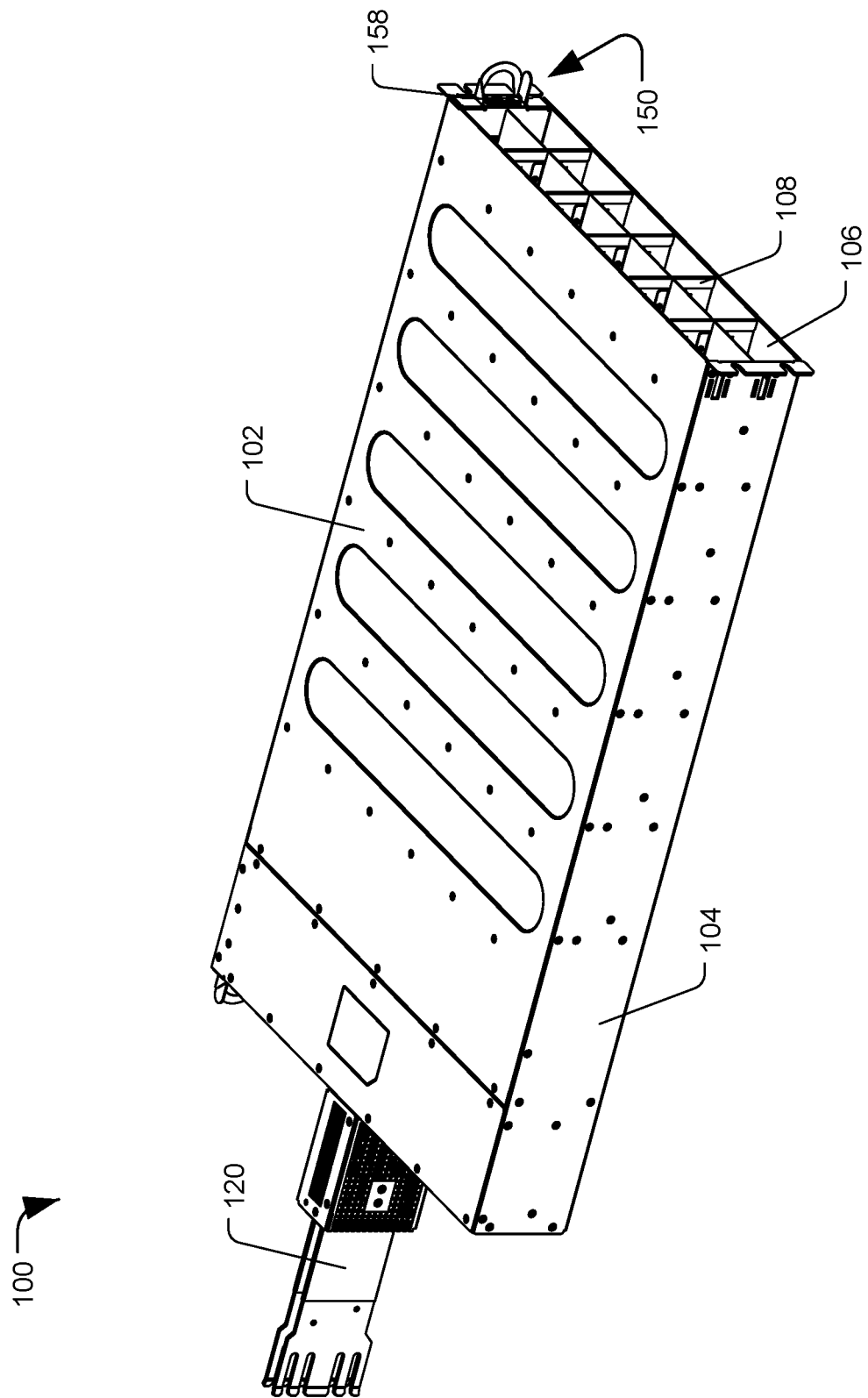
FIG. 1 is an isometric view of a power shelf system with a front and rear loading circuit, in accordance with certain embodiments of the present disclosure.

FIG. 1 is an isometric view of a power shelf system with a front and rear loading circuit, generally designated 100, in accordance with certain embodiments of the present disclosure. The power shelf system 100 may an electronic device designed to be pluggable into a server rack to provide power for one or more data servers. The power shelf system 100 can include a housing or casing having a top portion 102, a first side wall 104, a second side wall opposite the first side wall (not shown in FIG. 1, shown as side wall 112 in FIG. 5), a bottom portion 106, and one or more dividers 108. The one or more dividers may create slots for PSUs to be inserted into the front of the power shelf system 100. The dividers, or partitions, can be substantially parallel to the first side wall 104 and the second side wall 112, the partition disposed between the top portion 102 and the bottom portion 106 to form at least two slots that allow a first power module to be inserted into a first slot on a first side of the partition 108 and a second power module to be inserted into a second slot on a second side of the partition 108.

A rear of the power shelf system may be at an opposite end of the system from the slot openings for the PSUs. An interface 120 may provide a physical and electrical connection to a server rack, which may be used to provide a direct current (DC) voltage output to a connected rack system.

Figure 2:
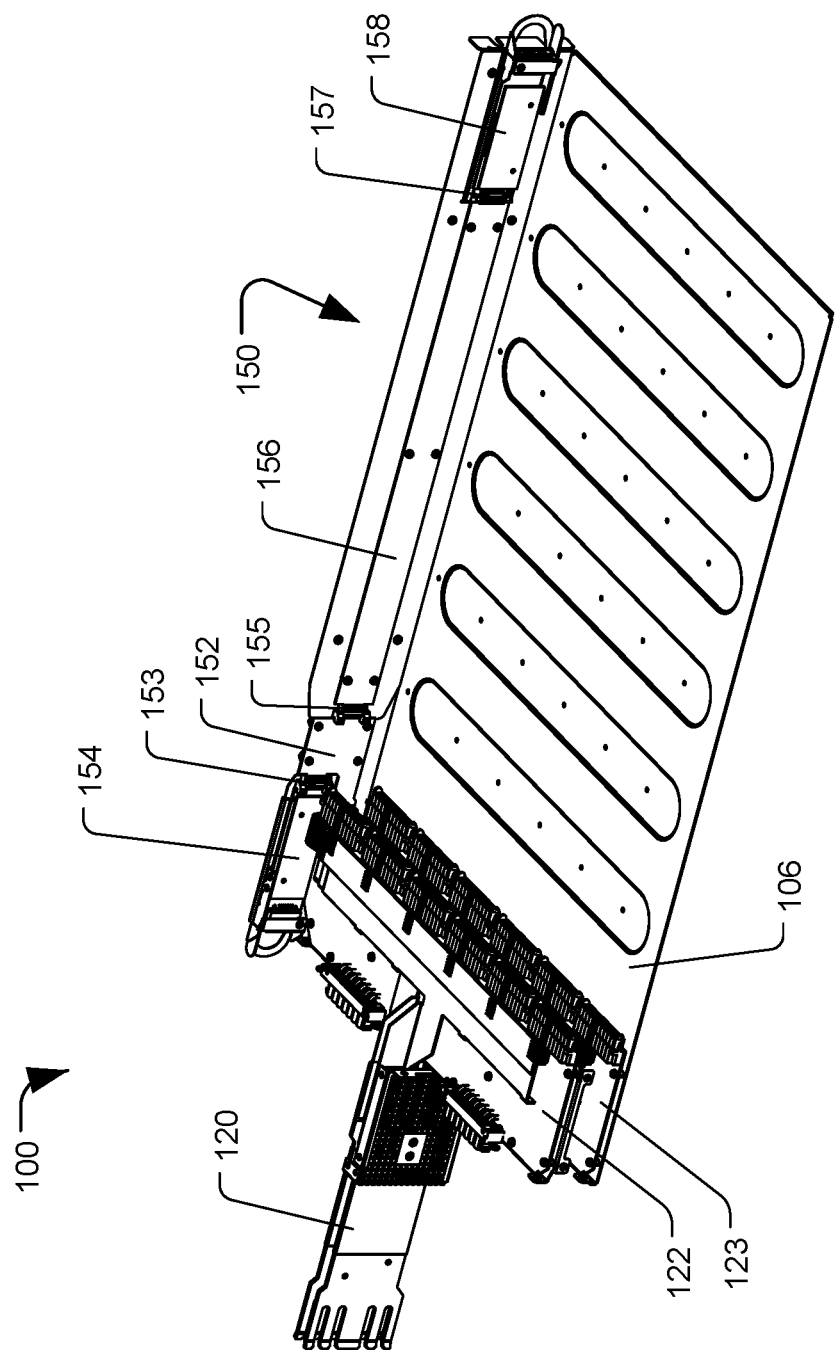
FIG. 2 is an isometric view of a power shelf system with a front and rear loading circuit, where the top cover and side wall have been removed, in accordance with certain embodiments of the present disclosure.

The power shelf system 100 may also include a shelf management control circuit 150, including a shelf management controller ("SMC") installed near the front or the rear of the power shelf system 100. The shelf management control circuit 150 can manage the operation and functions of the power shelf system 100. FIG. 2 shows the management control circuit in both a rear position and a front position. The management control circuit may also be referred to as a power management controller.

FIG. 2 is an isometric view of the power shelf system 100 with front and rear power management controllers or management circuits 154, 158, where the top cover 102 and side wall 104 have been removed, in accordance with certain embodiments of the present disclosure. The power shelf system can include a backplane 122. In some embodiments, there may be more than one backplane, such as a dual backplane system with backplane 122 and backplane 123. The backplane 122 may be communicatively connected to the shelf management control circuit 150, such as by socket(s) or cable(s). The shelf management control circuit 150 does not occupy a slot of the power shelf where a PSU can be inserted; thus, the power shelf system 100 does not lose a PSU to have a front accessible SMC.

The backplane 122 can be situated within the power shelf near the back portion such that a rear of a PSU can physically connect to the backplane when inserted into a slot of the power shelf, the backplane extending along a length of the back portion behind the slots, and the shelf management control circuit 150 can be positioned within the power shelf between the backplane and the second side wall 112.

The shelf management control circuit 150 can include a mid-plane circuit 152 that can include a connection 162 (FIG. 5) to the backplane 122 and a first connector interface 153 to couple to a first management circuit 154, such as an SMC or power management controller. The mid-plane circuit 152 can also include a second connector interface 155 to couple to a second management circuit 158, such as an SMC or power management controller. In some embodiments, an interconnect circuit 156 can be included between the connector interface 155 and the second management circuit 158. The interconnect circuit 156 can include a first connector to couple to the second connector interface 155 and a second connector to connect to an interface 157 of the second management circuit 158. In some embodiments, the mid-plane circuit 152 and the interconnect circuit 156 are separate PCBs.

In some embodiments, only one of management circuit 154 and management circuit 158 may be installed at the same time. In other embodiments, both of management circuit 154 and management circuit 158 may be installed at the same time but only one of them can be active to control the management of the shelf system 100 at one time. In some embodiments, the first management circuit 154 and the second management circuit 158 can be interchangeable, or utilize the same exact circuit and connectors. In other embodiments, each of the first management circuit 154 and the second management circuit 158 may unique, such as by having a unique connector or unique control circuitry, and not interchangeable. Further, the management circuit 154 and 158 can be hot pluggable at both the second connector and the third connector.

As an example, a mid-plane circuit 152 can include a circuit having wiring, or traces, to provide a connection between a backplane of a power shelf and a power management controller, the circuit may include: a first connector configured to couple to the backplane; a second connector configured to have a first interface that physically couples the power management controller to the circuit such that the wiring or traces provide a connection between the first connector and the second connector to allow the power management controller to communicate with the backplane; a third connector configured to have a second interface that physically couples the power management controller to the circuit such that the wiring or traces provide a connection between the first connector and the third connector to allow the power management controller to communicate with the backplane; and when the circuit is installed in the power shelf, the second connector is accessible at a rear of the power shelf and the third connector is accessible at a front of the power shelf. Further, the circuit can include a printed circuit board (PCB) to which the first connector, second connector, and third connector are attached. The PCB can have multiple sets of traces to support communications and connections to each of the connectors. Even further, when the PCB is installed in a power shelf, the power management controller is accessible via the rear of the power shelf when the power management controller is connected to the second connector. Yet even further, the power management controller is accessible via the front of the power shelf when the power management controller is connected to the third connector.

In further examples, the mid-plane circuit 152 can connect to an interconnect circuit 156 including a fourth connector at a proximal end of the interconnect circuit and a fifth connector at a distal end of the interconnect circuit, the fourth connector configured to connect to the PCB via the third connector, and the fifth connector configured to connect to the power management controller, where the proximal end is located near the rear of the power shelf and the distal end is located near the front of the power shelf when the interconnect circuit is installed in the power shelf.

Figure 3:
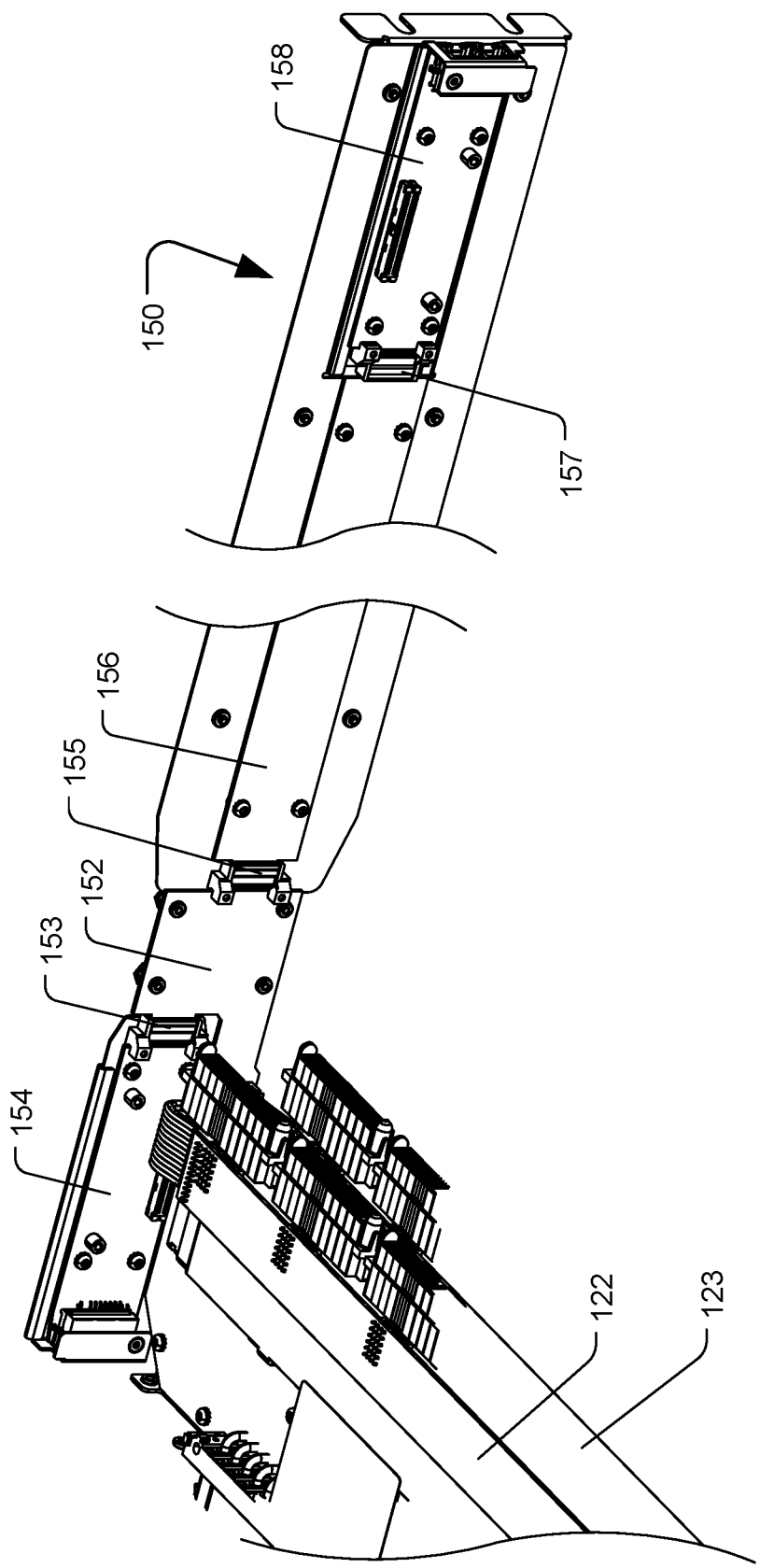
FIG. 3 is an isometric view of a front and rear loading circuit for a power shelf system, in accordance with certain embodiments of the present disclosure.
Figure 4:
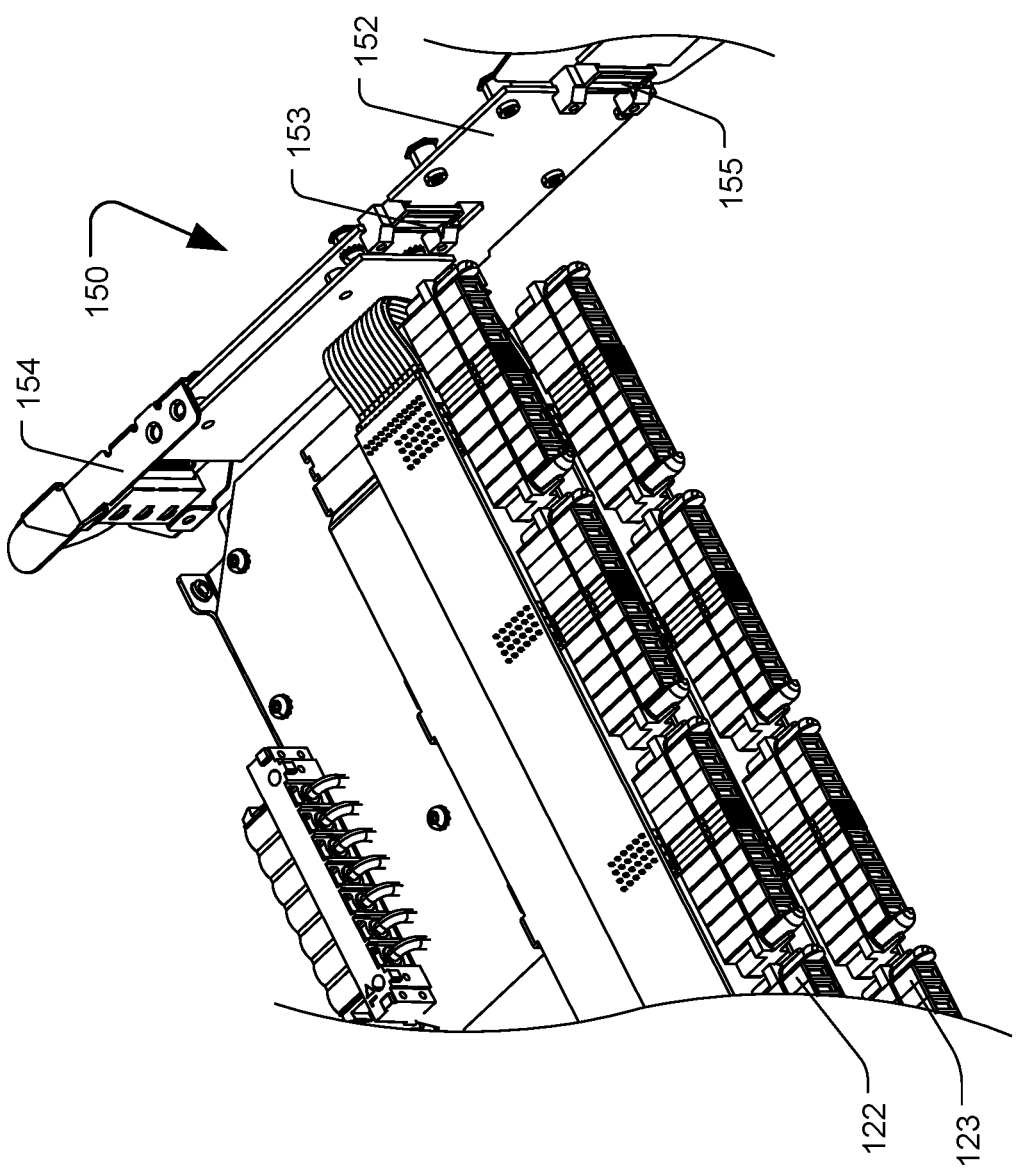
FIG. 4 is an isometric view of a front and rear loading circuit for a power shelf system, in accordance with certain embodiments of the present disclosure.

FIGS. 3 and 4 show further isometric views and various other details of the mid-plane board 152, the interconnect board 156, the first control circuit 154, and the second control circuit 158, in accordance with certain embodiments of the present disclosure.

Figure 5:
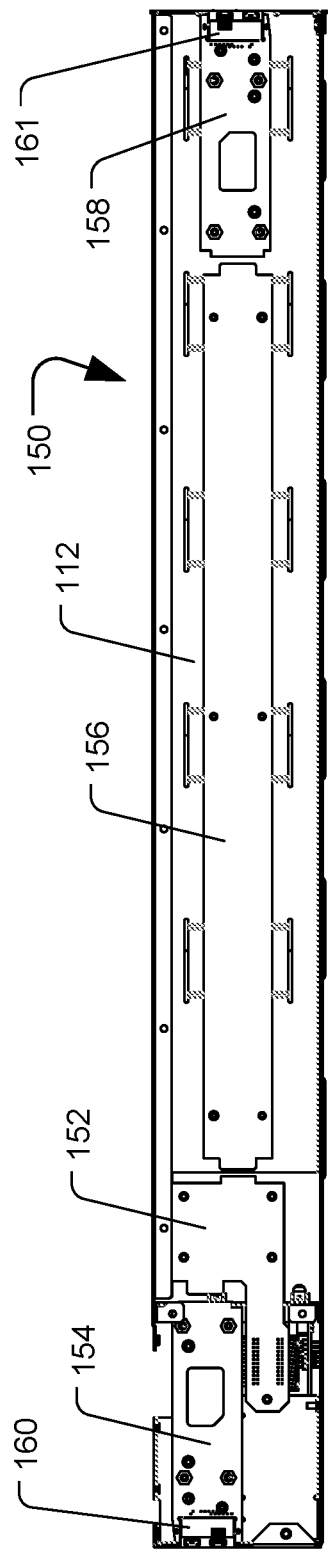
FIG. 5 is a side view of a front and rear loading circuit for a power shelf system, in accordance with certain embodiments of the present disclosure.

FIG. 5 shows a side view of a front and rear loading circuit for a power shelf system 100, in accordance with certain embodiments of the present disclosure. The front and rear loading circuit can include the mid-plane circuit 152 that includes the aforementioned interfaces to allow a management control circuit to be mounted along the sidewall 112 either towards the front of the power shelf such as control circuit 158, towards the rear of the power shelf such as control circuit 154, or both. Interconnect circuit 156 may be a separate piece that allows a connection between the mid-plane 152 and the front control circuit 158. Any of the circuits may be mounted to the sidewall 112.

Control circuit 154 and control circuit 158 may each include one or more external interfaces 160 and 161, respectively, that are accessible to a user or system outside of the power shelf housing. The interfaces 160 and 161 may be an ethernet port, a serial port, a parallel port, other communication port, or any combination thereof. For example, the interfaces 160 and 161 may include a Controller Area Network (CAN bus) standardized communication port configured to allow communication with a system management controller. Further, control circuits 154 and 158 may include one or more light emitting diode (LED) indicators.

Figure 6A:
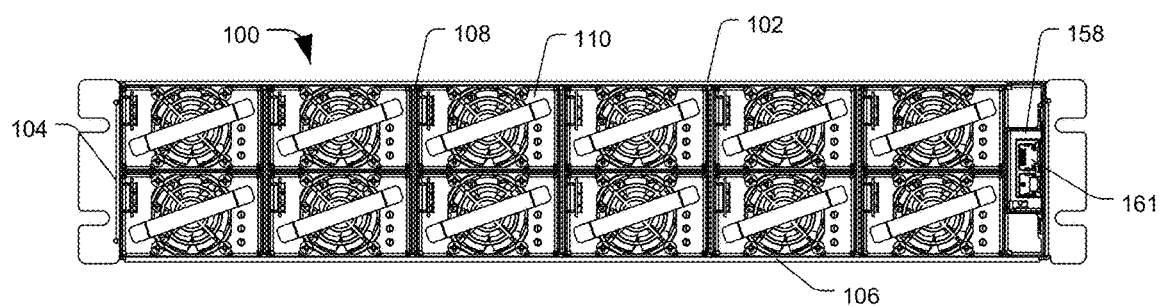
FIG. 6A is a front view of a power shelf system with a front and rear loading circuit, in accordance with certain embodiments of the present disclosure.

FIG. 6A shows a front view of the power shelf system 100 with a front and rear loading circuit, in accordance with certain embodiments of the present disclosure. FIG. 6A also shows multiple PSUs 110 inserted into the slots defined by the partitions 108. While twelve PSUs are shown, a power shelf system can be designed and configured with any number of PSUs.

As shown, the power shelf system 100 can include the front-loading control circuit 158 on a side of the PSUs between the power supplies and a side wall. In other embodiments, the power shelf 100 can be designed to accommodate the control circuit 158 adjacent to the other side wall than as shown, or between power supplies.

In some embodiments, such as discussed in U.S. patent application Ser. No. 17/108,085, the width of the partitions 108 may be designed to allow more space within the power shelf 100. For example, in a power shelf system with a constrained width such as determined by a rack system into which the power shelf 100 can be mounted, relatively narrow partitions can provide space to allow the control circuit 158 to be mounted between the PSUs and a side wall of the power shelf 100, or between two PSUs. Thus, in some embodiments, when a power shelf system is width constrained, such as determined by a rack system, a narrow partition width can be utilized to allow the front-loading control circuit 161 to be implemented. For example, in a nineteen (19) inch rack system, a power shelf system can have the front-loaded control circuit 158 and six (6) power supply units in a row across a width, from sidewall to sidewall, of the power shelf system. In further embodiments, there may be two or more rows of six power supply units in a nineteen inch form factor power shelf system that has such a front-loaded control circuit.

Figure 6B:
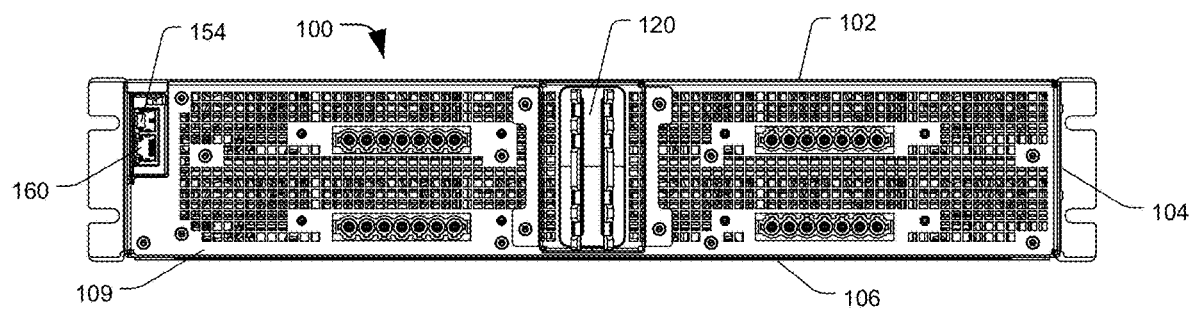
FIG. 6B is a rear view of a power shelf system with a front and rear loading circuit, in accordance with certain embodiments of the present disclosure.

FIG. 6B shows a rear view of the power shelf system 100 with a front and rear loading circuit, in accordance with certain embodiments of the present disclosure. As shown, the power shelf system 100 can include the rear-loading control circuit 154 adjacent to a side wall of the power shelf 100. In other embodiments, the control circuit 154 can be located adjacent to the other side wall or in another position that is not adjacent to either side wall. In these configurations, the rear-loading circuit 154 can have one or more communication ports 160 that are accessible through a rear wall or cover 109.

A site or rack management controller (not shown) can be connected to the communication ports 160 or 161 to provide rack or facility level monitoring through the communication ports.

Figure 7:
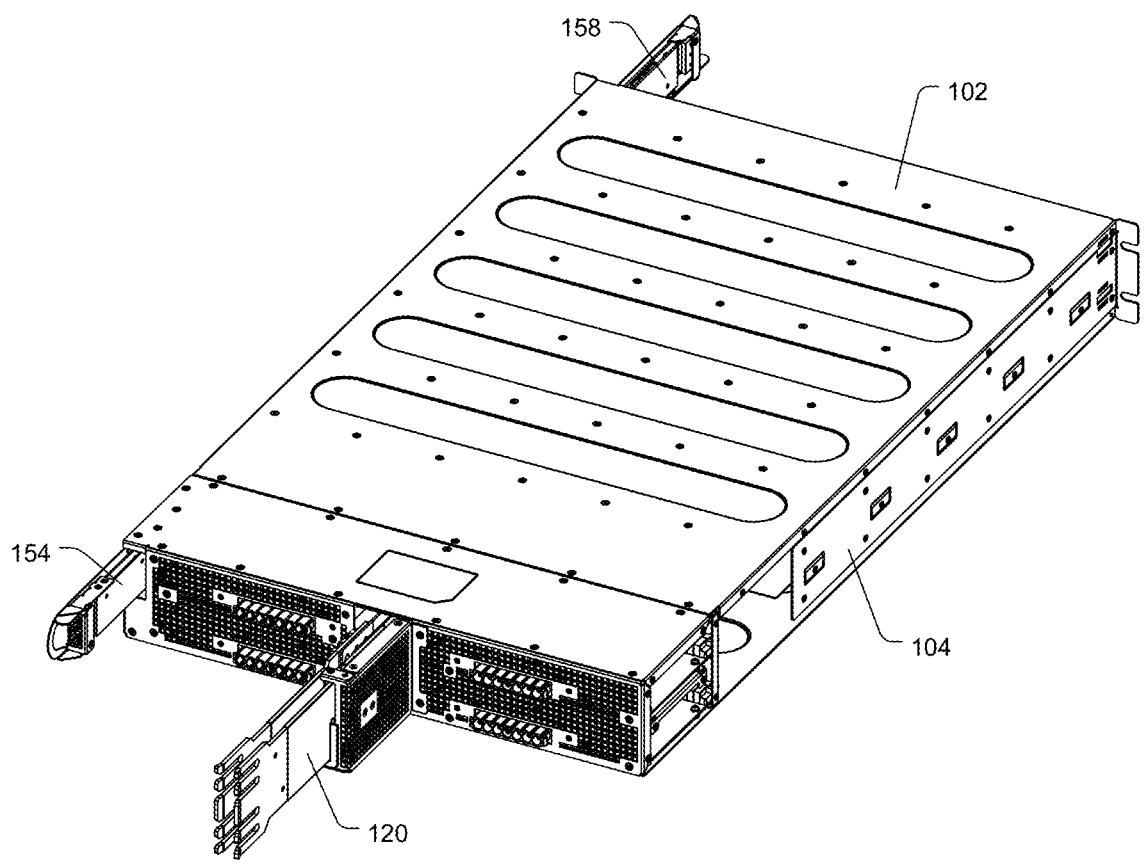
FIG. 7 is an isometric view of a power shelf system with a front and rear loading circuit, with a rear loading control circuit and a front loading control circuit both shown in an insertion/extraction position, in accordance with certain embodiments of the present disclosure.

FIG. 7 shows an isometric view of a power shelf system 100 with a front and rear loading circuit, where the rear-loading control circuit 154 and the front-loading control circuit 158 are both shown in an insertion or extraction position, in accordance with certain embodiments of the present disclosure. The power shelf system 100 can include a slot or opening in the front of the power shelf to allow the front-loading control circuit 158 to be inserted into the power shelf and to be removed from the power shelf, such as by activating a latch mechanism. The power shelf system 100 can also include a slot or opening in the rear of the power shelf to allow the rear-loading control circuit 154 to be inserted into the power shelf and to be removed from the power shelf, such as by activating a latch mechanism. When the control circuits are inserted into the power shelf system 100, they may be communicatively coupled to a backplane through a mid-plane circuit 152.

Each of the rear-loading control circuit 154 and the front-loading control circuit 158 can be separate components from the power shelf system 100. For example, the control circuits can each have their own printed circuit board(s) (PCBs), housing, interface connectors, electronics, ports, or other hardware or software.

In some embodiments, the rear-loading circuit 154 and the front-loading circuit 158 can both be hot-pluggable into the power shelf system 100. A circuit can be hot pluggable when it is capable of being connected to another circuit without powering down, that is shutting off, the power to the other circuit. This may also be referred to as hot swappable. In further embodiments, both the rear-loading circuit 154 and the front-loading circuit 158 can both be mounted within the power shelf system 100 simultaneously. For example, a switch, such as a logic circuit, physical switch, software, or a combination thereof, can determine which of the two control circuits is active at a specific time or during a specific configuration.

The circuits described herein can be implemented by PCBs, discrete electronics, programmable controllers, pin connectors, wire connectors, other electronic or circuit components, or any combination thereof.

Figure 8:
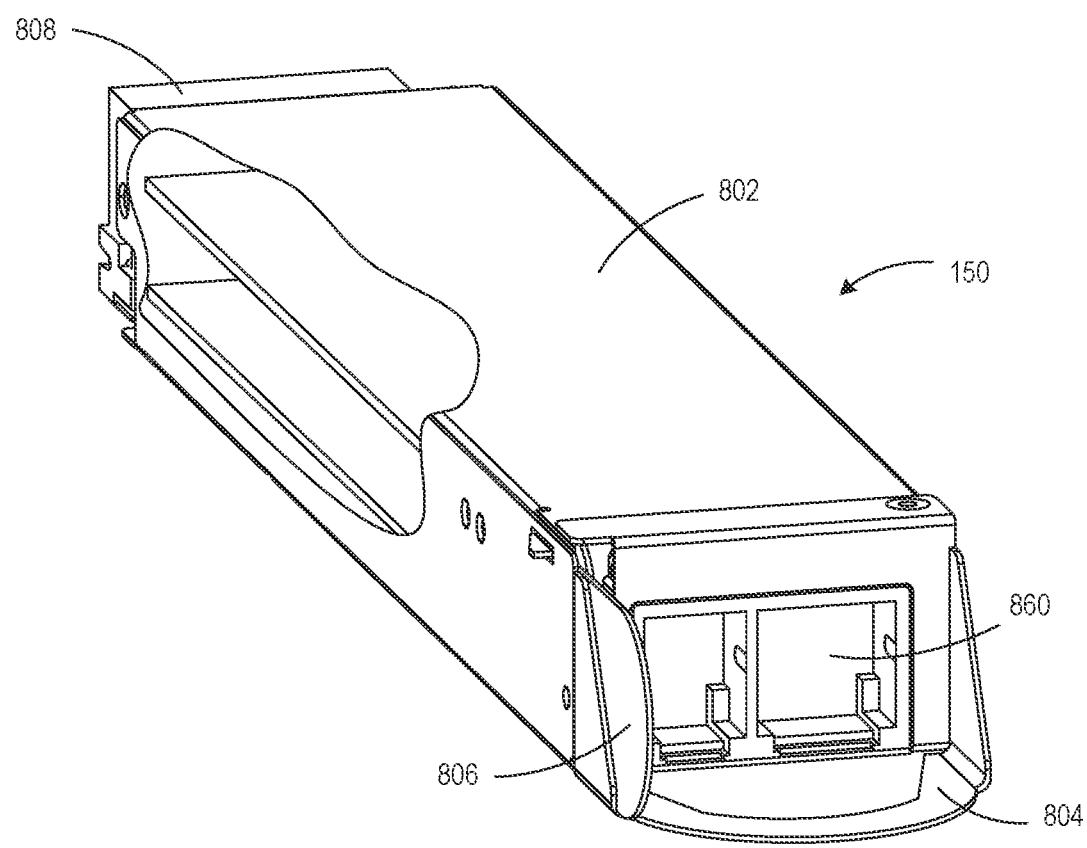
FIG. 8 is an isometric view of a shelf management controller ("SMC") compatible with the power shelf systems described herein, in accordance with certain embodiments of the present disclosure.

FIG. 8 shows an isometric view of a shelf management controller ("SMC"), which may be referred to as a power management controller, that is compatible with the power shelf systems described herein. The SMC can include a housing 802, a handle 804, a latch 806, an interface 808, and one or more communication ports 860. The interface can be a physical interface configured to connect to a mid-plane circuit or an interconnect circuit, such as mid-plane circuit 152 or interconnect 156, where the physical interface provides connections for communication through the mid-plane circuit to a backplane. The communication port(s) 860 can be accessible to an external system, such as a rack management controller or facility management controller. The latch may be activated to remove or insert the SMC, such as when the SMC may be hot plugged into or removed from a power shelf.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments can be made, and other embodiments not specifically described herein will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An electrical device comprising:
   a backplane of a power shelf, the backplane comprising a backplane connector; and
   a shelf management control circuit having wiring, or traces, to provide a connection between the backplane and a power management controller, the shelf management control circuit including:
      a first connector coupled with the backplane connector;
      a second connector configured to have a first interface that physically couples the power management controller to the shelf management control circuit such that the wiring or traces provide a connection between the first connector and the second connector to allow the power management controller to communicate with the backplane;
      a third connector configured to have a second interface that physically couples the power management controller to the shelf management control circuit such that the wiring or traces provide a connection between the first connector and the third connector to allow the power management controller to communicate with the backplane; and
      an interconnect circuit including:
         a fourth connector at a proximal end of the interconnect circuit and configured to connect to the third connector; and
         a fifth connector at a distal end of the interconnect circuit and configured to connect to the power management controller;
         wherein the proximal end is located near a rear of the power shelf and the distal end is located near a front of the power shelf when the interconnect circuit is installed in the power shelf; and
      when the shelf management control circuit is installed in the power shelf, the second connector is accessible via the rear of the power shelf and the third connector is accessible via the front of the power shelf.

2. The electrical device of claim 1 further comprising the shelf management control circuit includes a printed circuit board (PCB) to which the first connector, second connector, and third connector are attached.

3. The electrical device of claim 2 further comprising, when the PCB is installed in the power shelf, the power management controller is accessible via the rear of the power shelf when the power management controller is connected to the second connector.

4. The electrical device of claim 3 further comprising the power management controller is accessible via the front of the power shelf when the power management controller is connected to the third connector.

5. The electrical device of claim 1 further comprising the power shelf configured to hold multiple power modules, the power shelf including a first side wall, a second side wall, a top portion, a bottom portion, a back portion, and a partition substantially parallel to the first side wall and the second side wall, the partition disposed between the top portion and the bottom portion to form at least two slots that allow a first power module to be inserted into a first slot on a first side of the partition and a second power module to be inserted into a second slot on a second side of the partition.

6. The electrical device of claim 5 further comprising the backplane situated within the power shelf near the back portion such that a rear of a power module can physically connect to the backplane when inserted into a slot, the backplane extending along a length of the back portion, and the shelf management control circuit positioned within the power shelf between the backplane and the first side wall.

7. The electrical device of claim 5 further comprising the shelf management control circuit does not occupy a slot of the power shelf.

8. The electrical device of claim 1 further comprising the power management controller is hot pluggable at both the second connector and the third connector.

9. An electrical system comprising:
   a backplane of a server power shelf, the backplane comprising a backplane connector; and
   a first printed circuit board (PCB) comprising:
      wiring to provide a connection between the backplane and a power management controller;
      a first connector coupled to the backplane connector;
      a second connector including a first interface configured to communicatively couple to the power management controller, where the wiring provides an electrical connection between the first connector and the second connector;
      a third connector including a second interface configured to communicatively couple to the power management controller, where the wiring provides an electrical connection between the first connector and the third connector; and
   a second PCB including:
      a fourth connector at a proximal end of the second PCB and configured to connect to the first PCB via the third connector; and
      a fifth connector at a distal end of the second PCB and configured to communicatively connect to the power management controller;
      wherein the proximal end is located near a rear of the power shelf and the distal end is located near a front of the power shelf when the second PCB is installed in the power shelf; and when the electrical system is installed in the server power shelf, the second connector is accessible at the rear of the server power shelf and the third connector is accessible at the front of the server power shelf.

10. The electrical system of claim 9 further comprising the power management controller is hot pluggable at both the second connector and the third connector.

11. The electrical system of claim 10 further comprising the power management controller is operable at only one of the second connector and the third connector at a same time.

12. The electrical system of claim 9 further comprising:
when the PCB is installed in the server power shelf, the power management controller is accessible via the rear of the server power shelf when the power management controller is connected to the second connector and the power management controller is accessible via the front of the server power shelf when the power management controller is connected to the third connector.

13. A device comprising:
a backplane of a server power shelf, the backplane comprising a connector;
a first printed circuit board (PCB) including:
first traces to provide a connection between the backplane and a management controller;
second traces to provide a connection between the backplane and the management controller;
a first connector coupled to the connector of the backplane;
a second connector configured to communicatively couple the management controller to the second connector such that the first traces provide an electrical connection between the first connector and the second connector;
a third connector configured to communicatively couple the management controller to the third connector such that the second traces provide an electrical connection between the first connector and the third connector; and
the first PCB configured to be installed in the server power shelf such that the second connector is accessible at a proximal end of the server power shelf nearest the backplane and the third connector is accessible at a distal end of the server power shelf; and
a second PCB including a fourth connector at a proximal end of the second PCB and a fifth connector at a distal end of the second PCB, the fourth connector configured to connect to the first PCB via the third connector, and the fifth connector configured to connect to the management controller.

14. The device of claim 13 further comprising the management controller is hot pluggable at both the second connector and the third connector.

15. The device of claim 13 further comprising the first PCB configured to be installed within the server power shelf such that the management controller is accessible via a rear of the server power shelf when the management controller is communicatively coupled to the second connector and the management controller is accessible via a front of the server power shelf when the management controller is communicatively coupled to the third connector.

16. The device of claim 13 further comprising:
a housing defining the server power shelf, the housing including a first side wall, a second side wall, a top portion, a bottom portion, a back portion, and a partition substantially parallel to the first side wall and the second side wall, the partition disposed between the top portion and the bottom portion to form at least two slots that allow a first power module to be inserted into a first slot on a first side of the partition and a second power module to be inserted into a second slot on a second side of the partition;
the backplane situated within the server power shelf near the back portion such that a rear of each power module can physically connect to the backplane when inserted into a respective slot; and
the first PCB situated within the server power shelf between the backplane and the first side wall.

17. The device of claim 16 further comprising the management controller includes a communication interface accessible at the back portion of the housing when the management controller is communicatively coupled to the second connector and the communication interface is accessible at a front of the server power shelf when the management controller is communicatively coupled to the third connector.

* * * * *